(12) United States Patent
Kim

(10) Patent No.: US 6,373,546 B1
(45) Date of Patent: Apr. 16, 2002

(54) STRUCTURE OF A LIQUID CRYSTAL DISPLAY AND THE METHOD OF MANUFACTURING THE SAME

(75) Inventor: Jeom Jae Kim, Seoul (KR)

(73) Assignee: LG Philips LCD Co., Ltd., Seoul (KR)

( * ) Notice: Subject to any disclaimer, the term of this patent is extended or adjusted under 35 U.S.C. 154(b) by 0 days.

(21) Appl. No.: 08/892,438

(22) Filed: Jul. 14, 1997

(30) Foreign Application Priority Data

Mar. 3, 1997 (KR) ............................................. 97-6956

(51) Int. Cl.[7] ..................... G02F 1/1345; G02F 1/136; G02F 1/1333; G02F 1/1343
(52) U.S. Cl. ..................... 349/152; 349/43; 349/54; 349/139; 349/149
(58) Field of Search ........................... 349/43, 46, 147, 349/54, 152, 42, 41, 143, 139, 149

(56) References Cited

U.S. PATENT DOCUMENTS

| | | | | |
|---|---|---|---|---|
| 5,162,933 A | * | 11/1992 | Kakuda et al. | 359/59 |
| 5,317,433 A | * | 5/1994 | Miyawaki et al. | 349/45 |
| 5,339,181 A | | 8/1994 | Kim et al. | 359/59 |
| 5,462,887 A | | 10/1995 | Gluck | 437/48 |
| 5,668,379 A | * | 9/1997 | Ono et al. | 349/43 |
| 5,731,856 A | * | 3/1998 | Kim et al. | 349/43 |
| 5,771,083 A | * | 6/1998 | Fujihara et al. | 349/147 |
| 5,793,460 A | * | 8/1998 | Yang | 349/148 |
| 5,847,781 A | * | 12/1998 | Ono et al. | 349/44 |

FOREIGN PATENT DOCUMENTS

| | | |
|---|---|---|
| DE | 4219665 | 11/1993 |
| DE | 4339721 | 2/1995 |
| EP | 0616241 | 9/1994 |
| JP | 06267986 | 9/1994 |
| JP | 07020490 | 1/1995 |
| JP | 08122822 | 5/1995 |

OTHER PUBLICATIONS

Patent Abstracts of Japan, English Language Abstract of Publication No. 09095083A, Apr. 12, 1996, "Liquid Crystal Display Device".
Patent Abstracts of Japan, English Language Abstract of Publication No. 07230100A, Aug. 29, 1995, "Liquid Crystal Display Device And Its Production".

* cited by examiner

Primary Examiner—William L. Sikes
Assistant Examiner—Tarifur R. Chowdhury
(74) Attorney, Agent, or Firm—Birch, Stewart, Kolasch & Birch, LLP

(57) ABSTRACT

An active panel of a liquid crystal display having a thin film transistor and a pixel electrode arranged in a matrix pattern has a double gate bus line. On a substrate, a gate bus line, a gate electrode and a gate pad are formed using a first metal such as aluminum having low electrical resistance and a second metal such as chromium having surface stability. Then, a dummy source bus line and a dummy source pad are formed prior to forming a source bus line and a source pad so as to eliminate line disconnection due to the cracks thereof and to thereby reduce the defects of the active panel and the increase production yield of the manufacturing process.

33 Claims, 14 Drawing Sheets

STRUCTURE OF A LIQUID CRYSTAL DISPLAY AND THE METHOD OF MANUFACTURING THE SAME

BACKGROUND OF THE INVENTION

1. Field of the Invention

The present invention relates to an active matrix liquid crystal display (AMLCD) having active panels including thin film transistors (TFTs) and pixel electrodes arranged in a matrix pattern and a method of manufacturing the AMLCD, and more particularly, a method for reducing defects occurring at the source bus line and the source pad in a step of forming a double gate bus line of an AMLCD.

2. Description of the Related Art

Among various display devices displaying images on a screen, thin film type flat panel display devices are widely used because they are relatively thin and light weight. Particularly, a liquid crystal display is actively being developed and studied because the LCD provides a sufficiently high resolution and a sufficiently fast response time to display a motion picture.

The principle of the LCD uses optical anisotrophy and polarization property of liquid crystal materials. The liquid crystal molecules are relatively thin and long having orientation and polarization properties. Using these properties, the orientation in which the liquid crystal molecules are arranged can be controlled by applying an external electric field. Depending on the orientation of the liquid crystal molecules, light is allowed to either pass through the liquid crystal or is prevented from passing through the liquid crystal. A liquid crystal display effectively uses this characteristic behavior of liquid crystal.

Recently, AMLCDs which include TFTs and pixel electrodes arranged in a matrix pattern have received much attention because they provide enhanced picture quality and natural colors.

The structure of a conventional liquid crystal display is described below. The conventional liquid crystal display includes two panels each having many elements disposed thereon, and a liquid crystal layer formed between the two panels. The first panel (or color filter panel) located at a first side of the conventional liquid crystal display includes red (R), green (G), and blue (B) color filters sequentially arranged to correspond with an array of pixels disposed on a transparent substrate of the first panel. Between these color filters, a black matrix is arranged in a lattice pattern. A common electrode is formed and disposed on the color filters.

On the other side or second side of the conventional liquid crystal display, the second panel (or active panel) includes a plurality of pixel electrodes which are located at positions corresponding to the positions of pixels and are disposed on a transparent substrate. A plurality of signal bus lines are arranged to extend in the horizontal direction of the pixel electrodes, whereas a plurality of data bus lines are arranged to extend in the vertical direction of the pixel electrodes. At a corner of the pixel electrode, a thin film transistor is formed to apply an electric signal to the pixel. The gate electrode of the thin film transistor is connected to a corresponding one of the signal bus lines (or gate bus lines), and the source electrode of the thin film transistor is connected to a corresponding one of the data bus lines (or source bus lines). The end portions of the gate and source bus lines include terminals or pads for receiving signals applied externally thereto.

The above described first and second panels are bonded together and arranged to face each other while being spaced apart by a predetermined distance (known as a cell gap) and a liquid crystal material is injected between the two panels into the cell gap.

The manufacturing process for the conventional liquid crystal panel is rather complicated and requires many different manufacturing steps. Particularly, the active panel having TFTs and pixel electrodes requires many manufacturing steps. Therefore, it is beneficial to reduce the manufacturing steps to reduce the possible defects which may occur during the manufacture of the active panel and to reduce the time, expense and difficulty involved in manufacturing the liquid crystal display.

In a conventional method of manufacturing an active panel, aluminum or its alloy of low electric resistance material is used to form the gate bus line and the gate electrode and the surface of the aluminum is anodized to prevent hill-lock, thereby forming an anodic oxide film. As a result, the method required at least 8 masking steps.

However, a subsequent development in the method of manufacture has resulted in the reduction in the number of required masking steps. For example, after forming gate bus lines and gate electrodes, the surface of the aluminum is covered with a metal layer such as chromium or molybdenum instead of anodizing. Therefore, the total number of masking steps is reduced by one or two masking steps by eliminating the anodizing step and cutting the shorting bar for providing the electrode of the anodizing.

The conventional method of manufacturing the active panel is described in more detail with reference to FIGS. 1–4d. FIG. 1 is a plan view showing a conventional active panel. FIGS. 2a–2d are cross-sectional views showing the TFT taken along line II—II in FIG. 1. FIGS. 3a–3d are cross-sectional views showing the gate pad and shorting bar taken along line III—III in FIG. 1. FIGS. 4a–4d are cross-sectional views showing the source pad taken along line IV—IV in FIG. 1.

On a transparent substrate 1, aluminum or aluminum alloy is vacuum deposited and patterned by photo-lithography to form a low resistance gate bus line 13a (FIG. 3a). Then, chromium or chromium alloy is vacuum deposited on the surface of the aluminum or aluminum alloy including the low resistance gate bus line 13a and patterned to form a gate electrode 11 and gate pad 15 (FIG. 2a). At this time, a gate bus line 13 is formed by patterning the chromium layer to completely cover the low resistance gate bus line 13a (FIG. 3b).

Next, an insulating material such as silicon oxid ($Si_xO_y$) and silicon nitride ($Si_xN_y$) is vacuum deposited on the surface including the gate bus line 13 to form a gate insulating layer 17 (FIG. 4a). Then, a semiconductor material such as an amorphous silicon and a doped semiconductor material such as impurity doped silicon are sequentially deposited on the insulating layer 17. The semiconductor material and the doped semiconductor material are etched at all locations except for an active area above the gate electrode 11 to form a semiconductor layer 35 and a doped semiconductor layer 37 seen in FIG. 2b. In this step of removing the semiconductor material and the doped semiconductor material, the semiconductor material and the doped semiconductor material located at portions corresponding to locations where a source pad and a source bus line are to be formed, are removed.

Next, chromium or chromium alloy is vacuum deposited on the surface including the doped semiconductor layer 37 and patterned to form a source electrode 21, a drain electrode 31, a source bus line 23 and a source pad 25. The source electrode 21 and the drain electrode 31 are formed over the gate electrode 11 and separated from each other by a desired distance. Using the source electrode 21 and the drain electrode 31 as a mask, the exposed portion of the doped semiconductor layer 37 between the source 21 and drain electrode 31 is removed (FIG. 2c). The source bus line 23 connects the source electrodes 31 in a row direction (FIG. 1) and the source pad 25 is formed at the end portion of the source bus line 23 (FIG. 4b).

An insulating material such as silicon oxide and silicon nitride is vacuum deposited on the surface including the source electrode 21, drain electrode 31 and the source pad 25 to form a protection layer 41 (FIG. 2d). Then, part of the protection layer is removed by patterning to form a drain contact hole 71 (FIG. 2d). At the same time, part of the protection layer 41 covering the source pad is removed to form a source pad contact hole 61 (FIG. 4c) and part of the protection layer 41 and the gate insulating layer 17 are removed to form a gate pad contact hole 51 (FIG. 3c).

Next, indium tin oxide is vacuum deposited on the surface including the protection layer 41 and patterned to form a pixel electrode 33, a source pad connecting terminal 67 and a gate pad connecting terminal 57. The pixel electrode 33 is connected with the drain electrode 31 through the drain contact hole 71 (FIG. 2e). The source pad connecting terminal 67 is connected with the source pad 25 through the source pad contact hole 61 (FIG. 4d). The gate pad connecting terminal 57 is connected with the gate pad 15 through the gate pad contact hole 51 (FIG. 3d).

As described above, the structure of the gate pad of the active panel formed by a conventional method includes a gate pad made of aluminum and a gate pad connecting terminal made of indium tin oxide which is connected with the gate pad through a gate pad contact hole. The structure of the source pad includes a source pad made of chromium and a source pad connecting terminal made of indium tin oxide which is connected with the source pad through the source pad contact hole. Thus, since the source pad is made of chromium, during the various process steps for forming the active panel, cracks may be formed in the source pad which causes line disconnection and thereby causes defects in the active panel of the liquid crystal display.

SUMMARY OF THE INVENTION

To overcome the problems described above, the preferred embodiments of the present invention provide a liquid crystal display and a method of manufacturing a liquid crystal display for preventing line disconnection at a source pad during manufacturing to thereby reduce defects in the active panel and increase the production yield of the manufacturing process.

According to one preferred embodiment of the present invention, a liquid crystal display includes a dummy source pad and a dummy source bus line to protect the source pad and to prevent line disconnection at the source pad.

According to another preferred embodiment of the present invention, a method of manufacturing a liquid crystal display, includes the steps of: forming a gate bus line on a substrate using a first conductive material thereon; forming an insulating layer on the substrate including the gate bus line by depositing an insulating material; forming a semiconductor layer, a doped semiconductor layer and a dummy source pad on the substrate including the gate insulating layer by depositing and patterning a semiconducting material and a doped material such as an impurity doped material; forming a source bus line and a source pad covering the dummy source pad on the substrate including the semiconductor layer, the doped semiconductor layer and the dummy source pad by depositing and patterning a second conductive material.

Further features, advantages and details of the present invention will become apparent from the detailed description of preferred embodiments provided hereafter. However, it should be understood that the description and specific examples, while indicating preferred embodiments of the invention, are given by way of illustration only, since various changes and modifications within the spirit and scope of the invention will become apparent to those skilled in the art from this detailed description.

These and other elements, features, and advantages of the preferred embodiments of the present invention will be apparent from the following detailed description of the preferred embodiments of the present invention, as illustrated in the accompanying drawings.

BRIEF DESCRIPTION OF THE DRAWINGS

The present invention will become more fully understood from the detailed description of preferred embodiments here below and the accompanying drawings which are given by way of illustration only, and thus are not limitative of the present invention, and wherein.

DETAILED DESCRIPTION OF PREFERRED EMBODIMENTS

According to preferred embodiments of the present invention, a low resistance gate bus line preferably is formed on a substrate using a first metal. A second metal is formed, preferably via vacuum deposition, on the substrate including the low resistance gate bus line and is patterned to form a gate electrode and a gate pad. At the same time, a gate bus line covering the low resistance gate bus line is preferably formed. An insulating material is formed, preferably via vacuum deposition, on the substrate including the gate electrode, the gate bus line and the gate pad to form a gate insulating layer. An intrinsic semiconductor material and a doped semiconductor material such as an impurity doped semiconductor material are sequentially deposited on the surface including the insulating layer and are patterned to form a semiconductor layer and a doped semiconductor layer. According to the preferred embodiments, during a step of etching the semiconductor material and the doped semiconductor material, portions of the intrinsic semiconductor material and the doped semiconductor material corresponding to locations of where a source pad and a source bus line are to be formed, are not removed but preferably remain at the positions where a source bus line and a source pad are to be formed so as to define a dummy source bus line and dummy source pad, as well as, a semiconductor layer and doped semiconductor layer covering the active area above the gate electrode. Then, a third metal is formed, preferably via vacuum deposition, on the substrate including the doped semiconductor layer, and is patterned to form a source electrode, a drain electrode, a source bus line and a source pad. An insulating material is deposited, preferably via vacuum deposition, on the substrate including the source electrode to form a protection layer. The protection layer located over the source electrode and the source pad is then removed to form a drain contact hole and a source pad contact hole, respectively. The protection layer and the insulating layer located over the gate pad are removed to form a gate pad contact hole. A conductive material is deposited, preferably via vacuum deposition, on the substrate including the protection layer and is patterned to form a pixel electrode connected with the drain electrode through the drain contact hole, a gate pad connecting terminal connected with the gate pad through the gate pad contact hole, and a source pad connecting terminal connected with the source pad through the source pad contact hole. The method of manufacturing an active panel according to a preferred embodiment of the present invention is described in more detail below.

EXAMPLE 1

Figure 1:
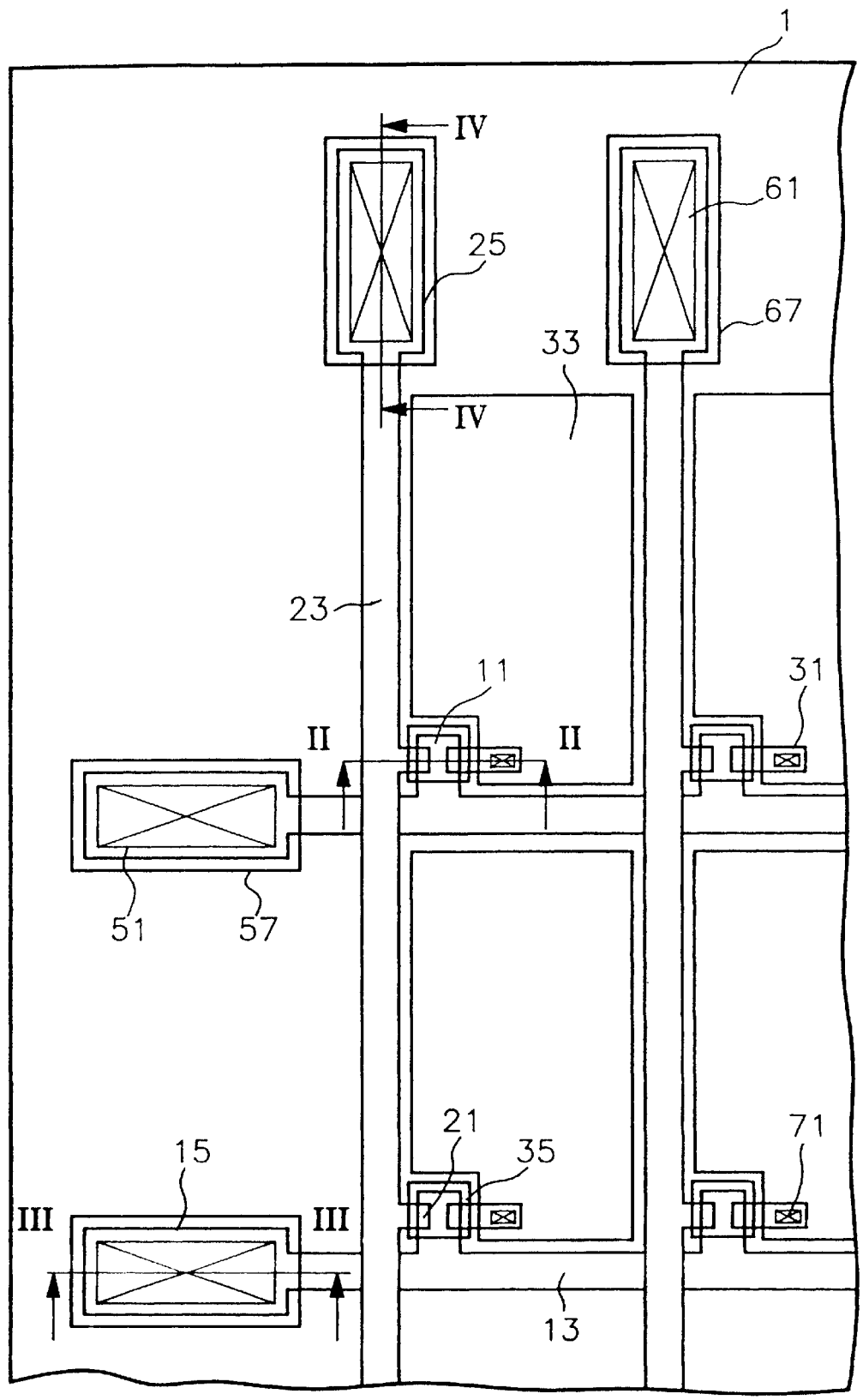
FIG. 1 is an enlarged plan view showing a conventional active panel.
Figure 2A:
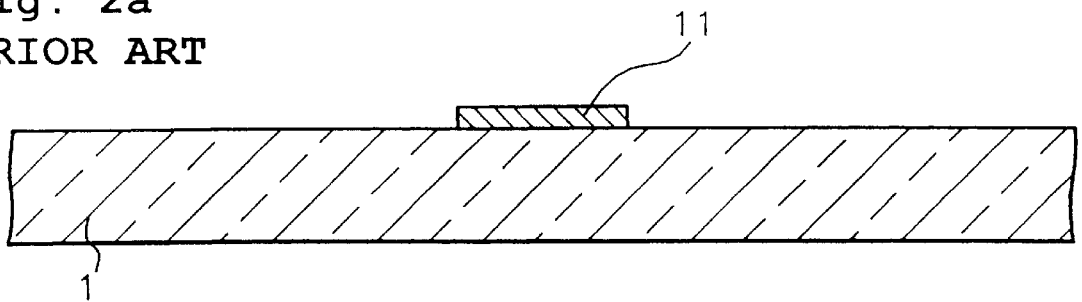
FIGS. 2a–2e are cross-sectional views showing the manufacturing steps of forming a TFT of a conventional active panel.
Figure 2B:
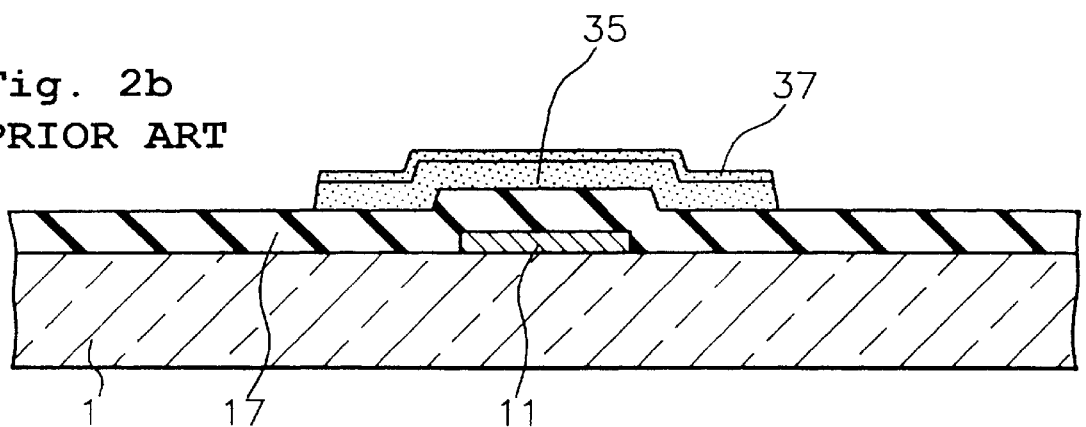
Figure 2C:
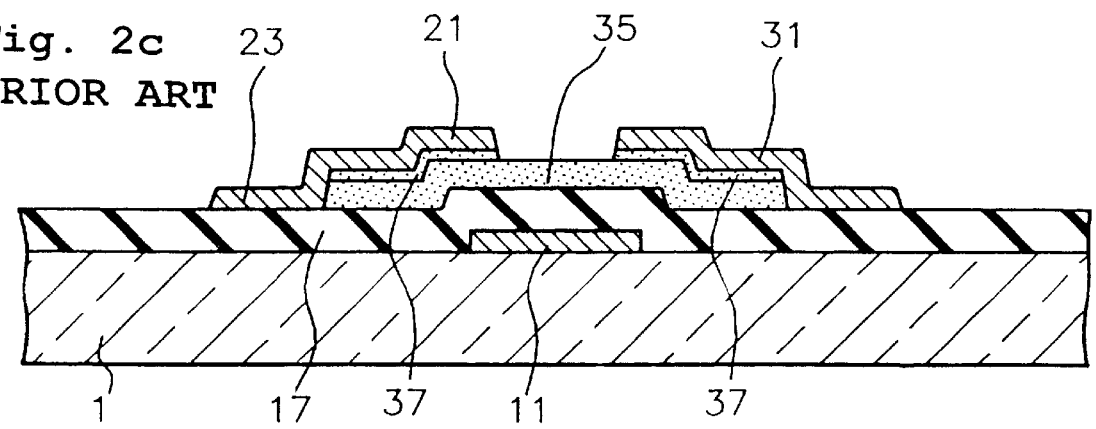
Figure 2D:
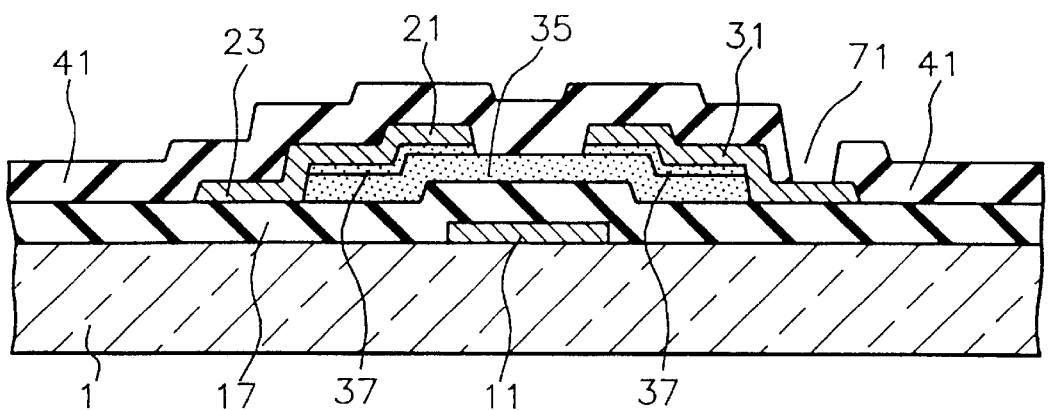
Figure 2E:
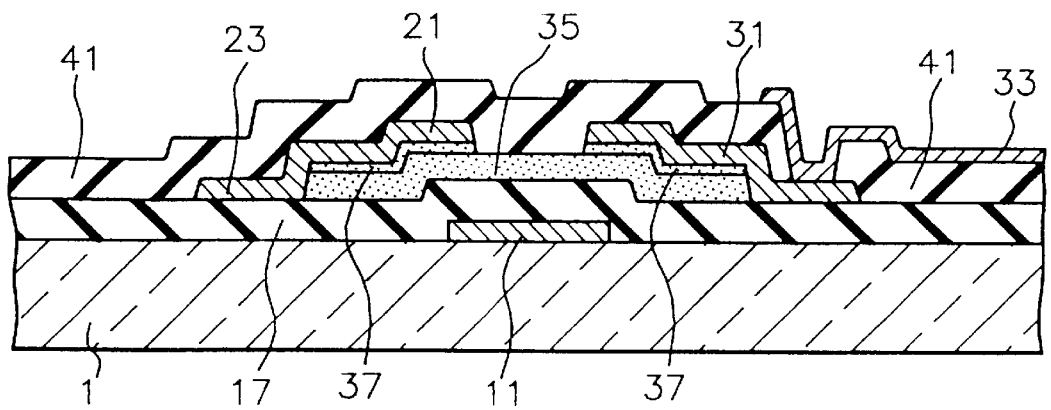
Figure 3A:
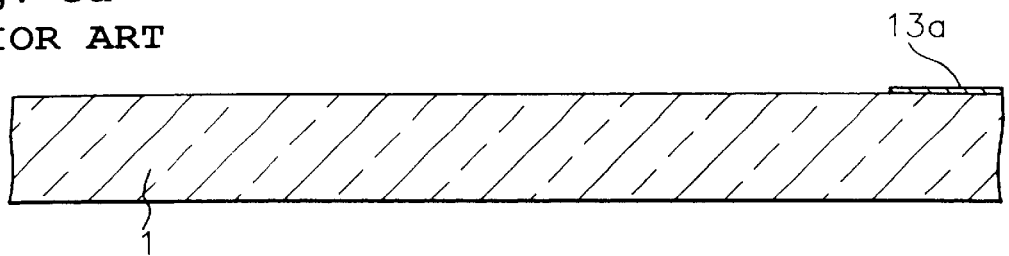
FIGS. 3a–3d are cross-sectional views showing the manufacturing steps of forming a gate pad and a gate bus line of a conventional active panel.
Figure 3B:
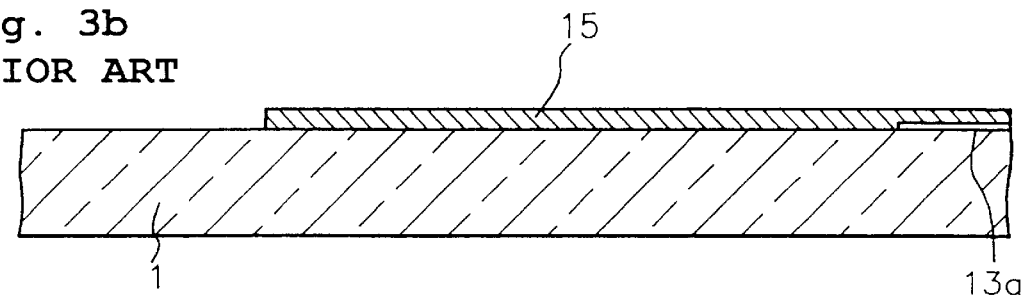
Figure 3C:
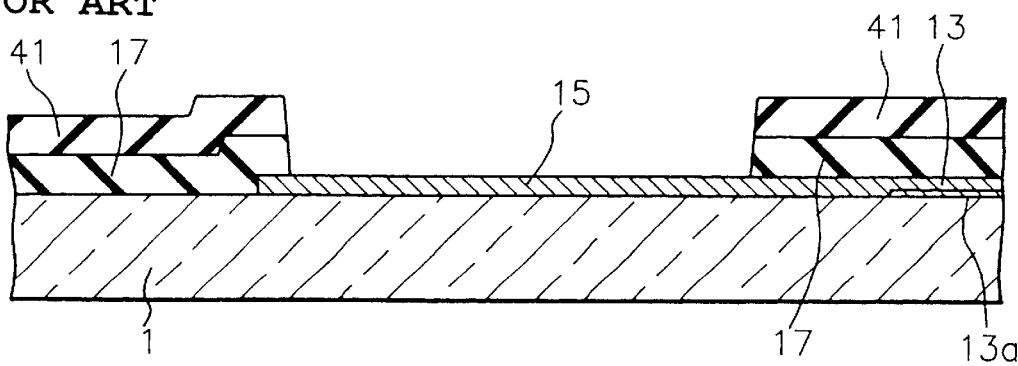
Figure 3D:
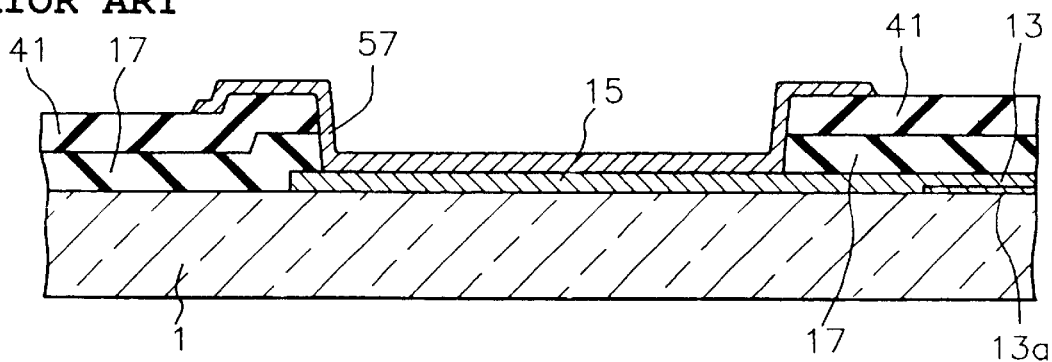
Figure 4A:
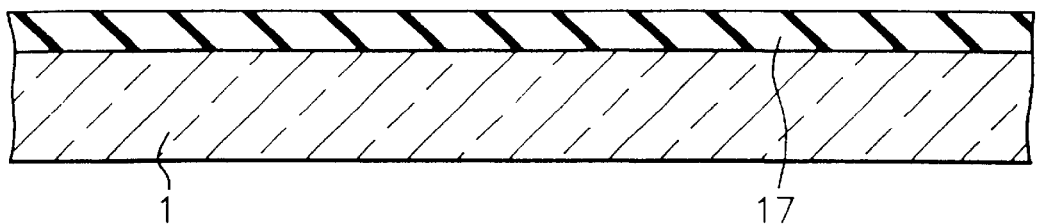
FIGS. 4a–4d are cross-sectional views showing the manufacturing steps of forming a source pad and a source bus line of a conventional active panel.
Figure 4B:
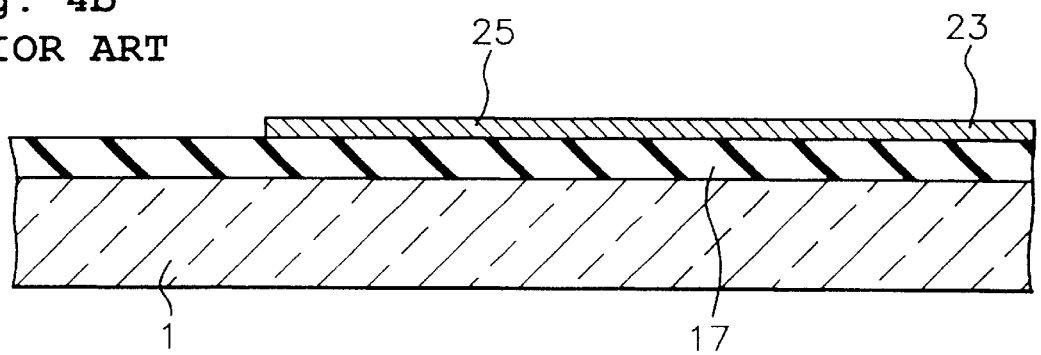
Figure 4C:
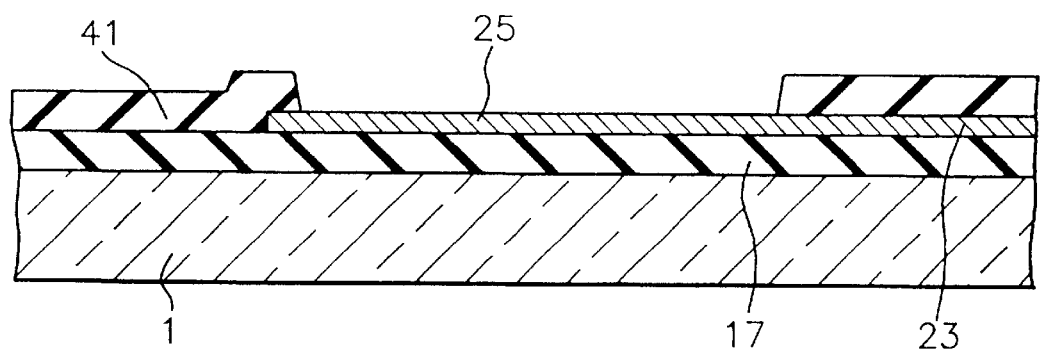
Figure 4D:
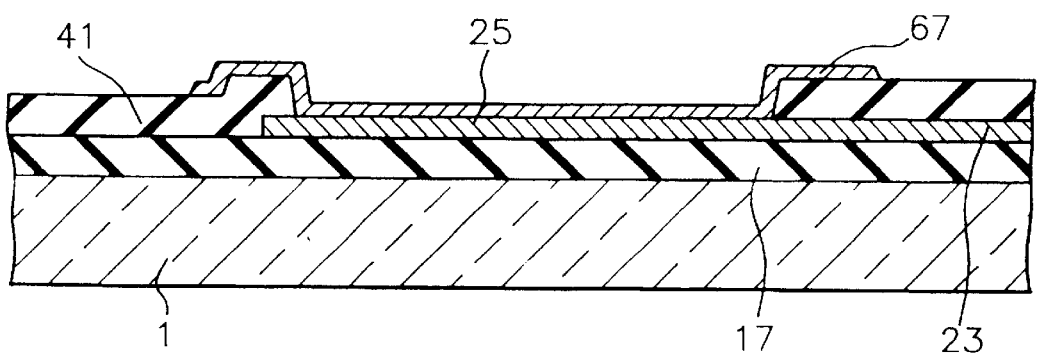
Figure 5:
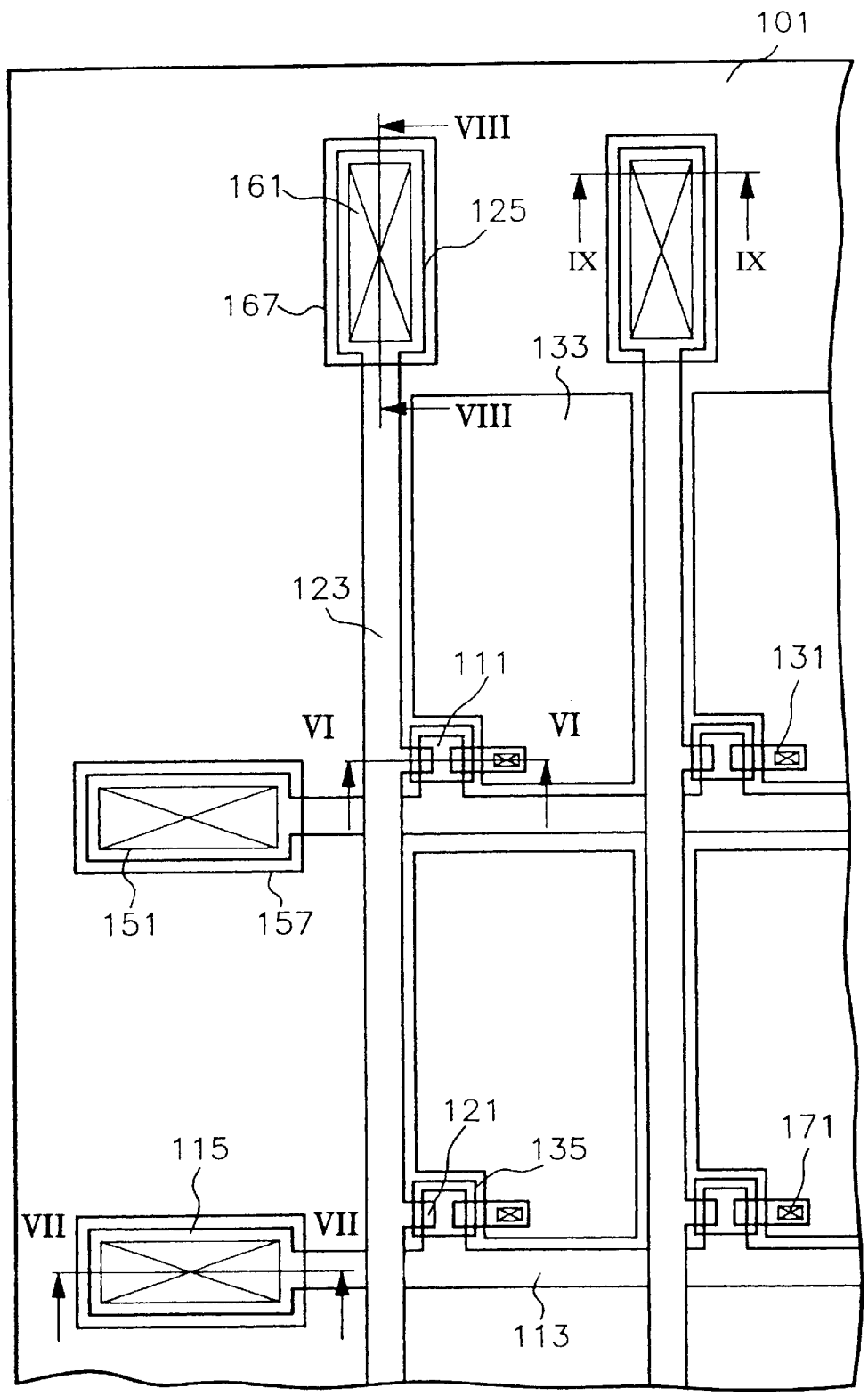
FIG. 5 is an enlarged plan view showing an active panel according to a preferred embodiment of the present invention.

With reference to FIGS. 5–9d, a first preferred embodiment of the present invention is described in more detail. FIG. 5 is a plan view of an active panel according to a preferred embodiment of the present invention. FIGS. 6a–6d are cross-sectional views showing the manufacturing steps of the TFT of the active panel taken along line VI—VI in FIG. 5. FIGS. 7a–7d are cross-sectional views showing the manufacturing steps of the gate pad and the gate bus line of the active panel taken along line VII—VII in FIG. 5. FIGS. 8a–8d are cross-sectional views showing the manufacturing steps of the source pad and the source bus line of the active panel taken along line VIII—VIII in FIG. 5. FIGS. 9a–9d are cross-sectional views showing the manufacturing steps of the source pad and the source bus line of the active panel taken along line IX—IX.

Figure 7A:
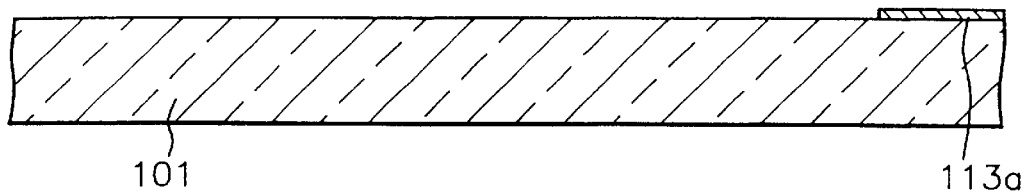
FIGS. 7a–7d are cross-sectional views showing the manufacturing steps of forming a gate pad and a gate bus line of an active panel according to a preferred embodiment of the present invention.

Aluminum or aluminum alloy is vacuum deposited on a transparent substrate 101 and patterned to form a low resistance gate bus line 113a which is formed at the position of a gate bus line 113 formed later (FIG. 7a).

Figure 6A:
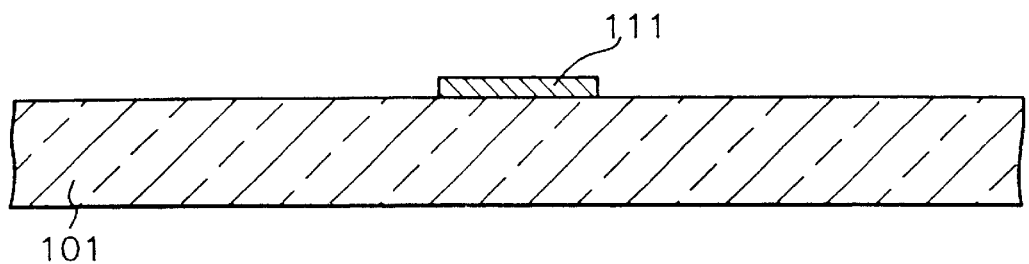
FIGS. 6a–6e are cross-sectional views showing the manufacturing steps of forming a TFT of an active panel according to a preferred embodiment of the present invention.
Figure 7B:
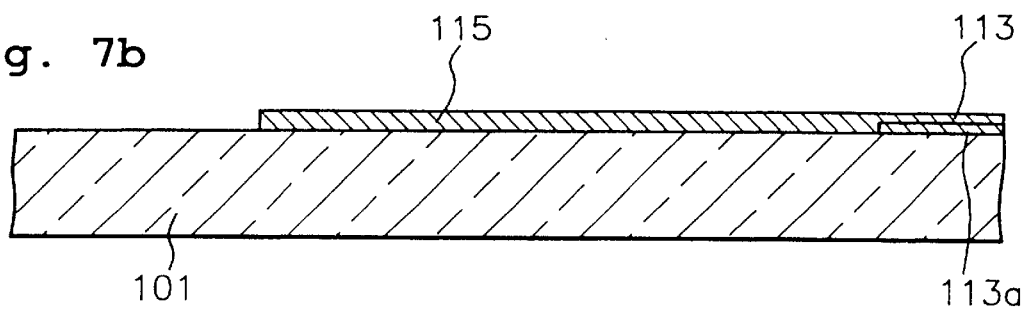

A metal such as chromium, tantalum, molybdenum and antimony is vacuum deposited on the substrate including the low resistance gate bus line 113a and patterned to form a gate electrode 111 and a gate pad 115 (FIG. 6a). At the same time, a gate bus line 113 made of the metal such as chromium, tantalum, molybdenum and antimony is formed to cover the low resistance gate bus line made of aluminum so as to prevent hill-lock on the surface of the aluminum. The gate pad 115 is preferably formed at the end of the gate bus line 113 (FIG. 7b).

An insulating material such as silicone oxide and silicone nitride is vacuum deposited on the substrate including the gate bus line 113 and the gate pad 115 to form a gate insulating layer 117.

Figure 6B:
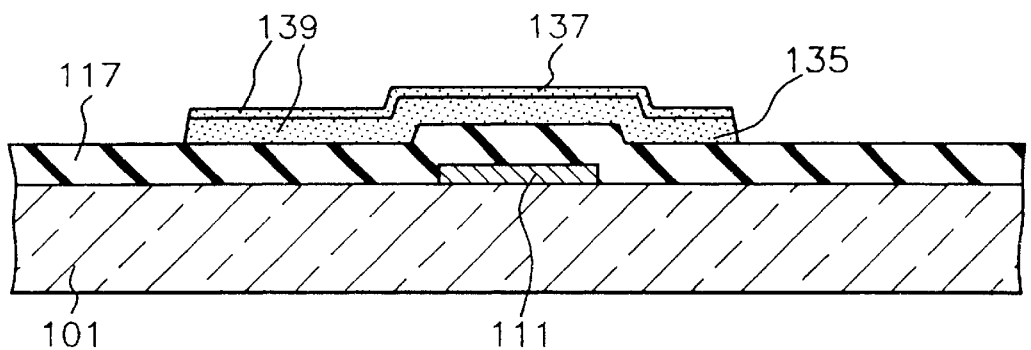
Figure 8A:
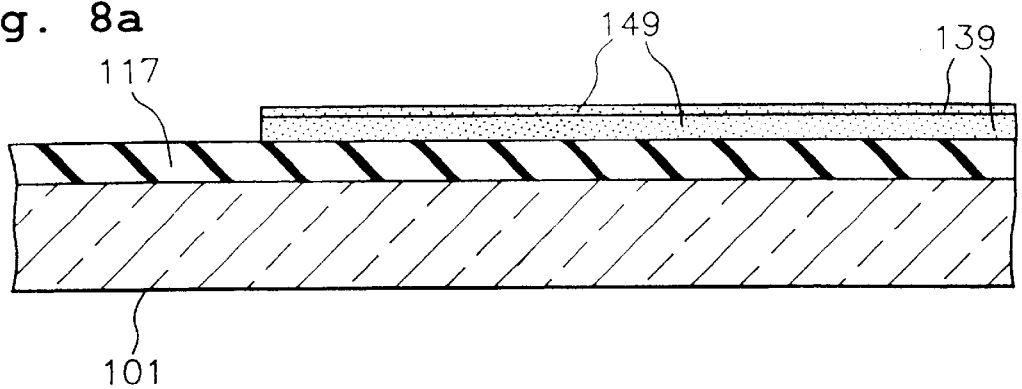
FIGS. 8a–8d are cross-sectional views showing the manufacturing steps of forming a source pad and a source bus line of an active panel according to a preferred embodiment of the present inventions.
Figure 9A:
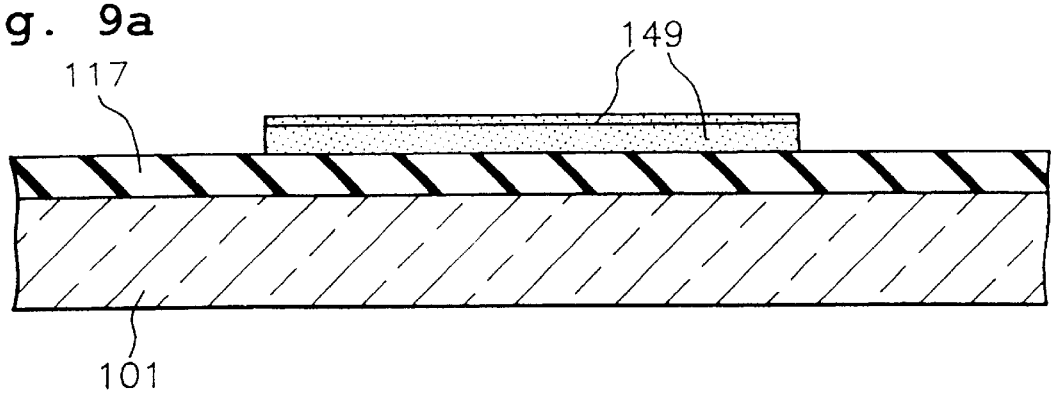
FIGS. 9a–9d are cross-sectional views showing the manufacturing steps of forming a source pad and a source bus line of an active panel according to a preferred embodiment of the present invention.

Then, a semiconducting material such as intrinsic amorphous silicon and a doped semiconducting material such as impurity doped amorphous silicon are sequentially deposited on the gate insulating layer 117 and patterned to form a semiconductor layer 135 and a doped semiconductor layer 137. During the patterning step, a dummy source bus line 139 and a dummy source pad 149 are formed respectively at a location where a source bus line 123 and a source pad 125 are to be formed, preferably by allowing portions of the semiconductor material and the doped semiconductor material to remain at locations corresponding to where a source pad 149 and source bus line 123 will be formed (FIG. 6b, FIG. 8a and FIG. 9a).

Figure 6C:
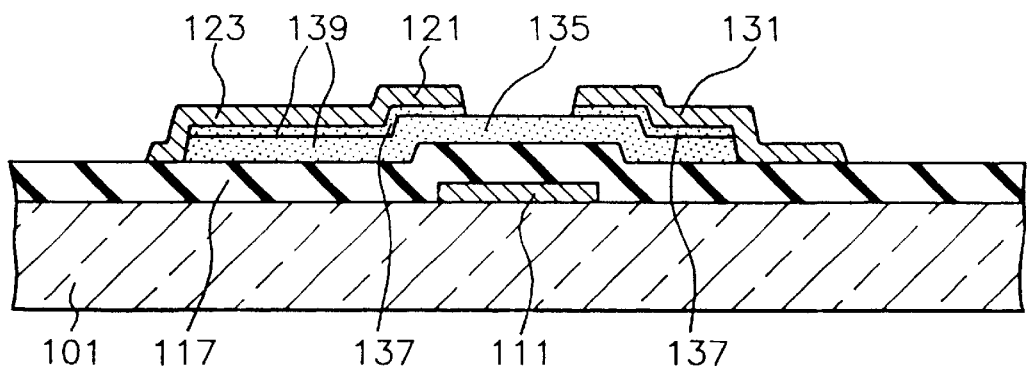
Figure 6D:
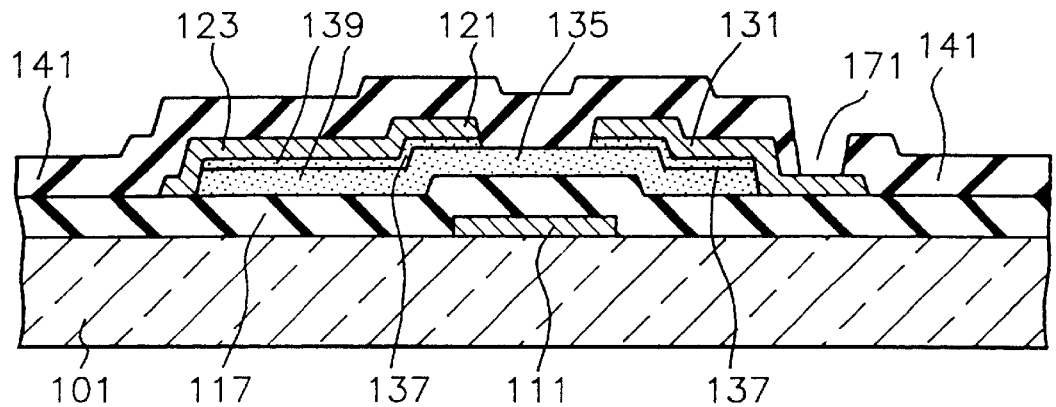
Figure 8B:
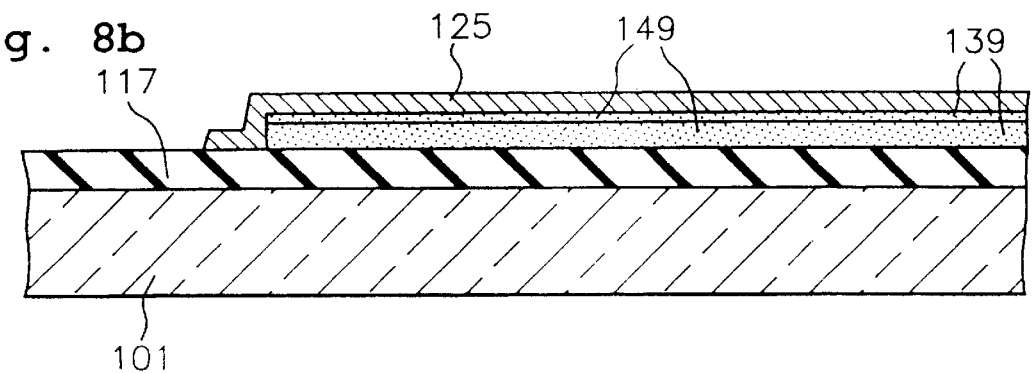
Figure 9B:
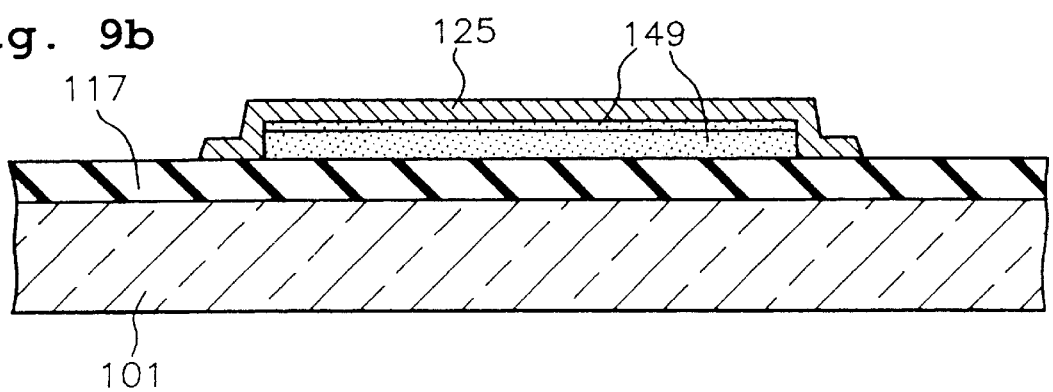

Next, chromium or chromium alloy is vacuum deposited on the substrate including the doped semiconductor layer 137 and patterned to form a source electrode 121, a drain electrode 131, a source bus line 123 and a source pad 125. Here, the source electrode 121 and the drain electrode 131 are formed over the gate electrode 111 and separated from each other. The exposed portion of the doped semiconductor layer 137 between the drain electrode 121 and the source electrode 131 is removed by etching, using the source electrode 121 and the drain electrode 131 as masks (FIG. 6c). The source bus line 123 connects the source electrodes 121 in a row direction. The dummy source bus line 139 preferably made of the semiconducting materials 135 and 137 is formed under the source bus line 123. The source pad 125 is formed at the end of the source bus line 123 and the dummy source pad 149 is formed under the source pad 125. The source bus line 123 and the source pad 125 cover the dummy source bus line 139 and the dummy source pad 149 formed thereunder, respectively (FIG. 8b and FIG. 9b).

Figure 7C:
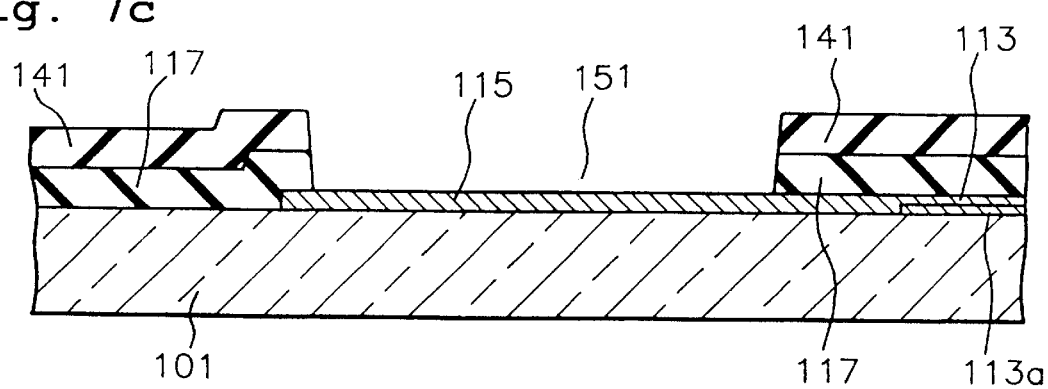
Figure 8C:
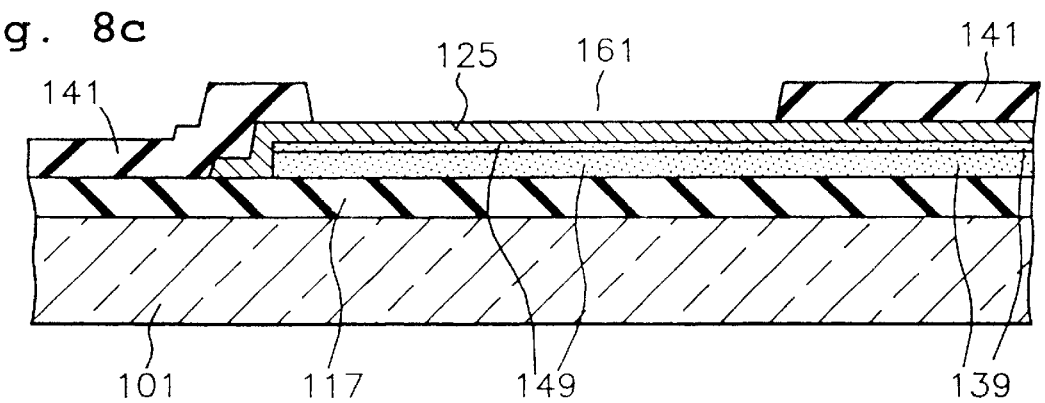
Figure 9C:
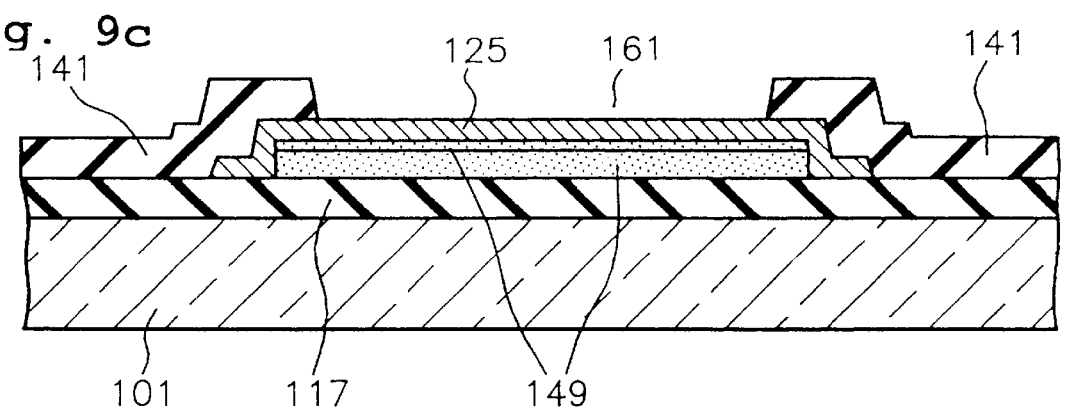

Next, an insulating material such as silicon oxide and silicon nitride is vacuum deposited on the substrate including the source electrode 121, source bus line 123, the source pad 125 and the drain electrode 131 to form a protection layer 141. The protection layer 141 is patterned to form a drain contact hole 171 on the drain electrode 131 (FIG. 6d) and a source pad contact hole 161 on the source pad 125 (FIG. 8c and FIG. 9c). At the same time, the protection layer 141 and the gate insulating layer 117 are simultaneously removed to form a gate pad contact hole 151 on the gate pad 115 (FIG. 7c).

Figure 6E:
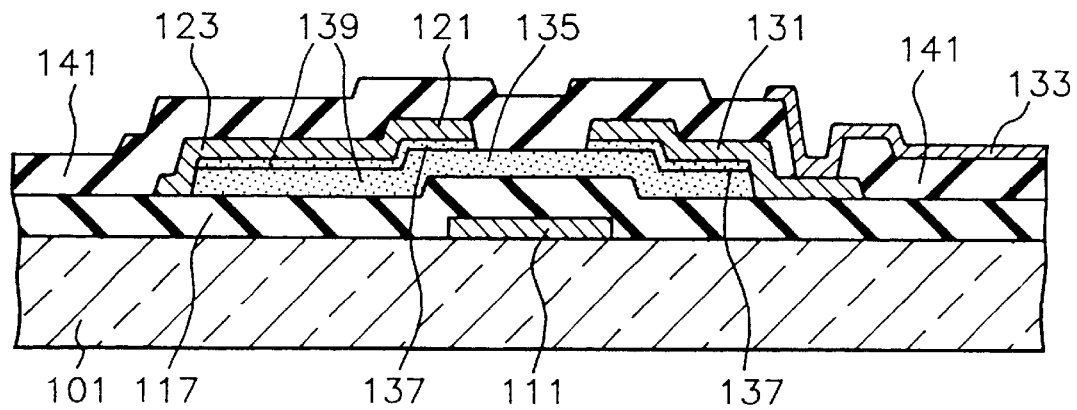
Figure 7D:
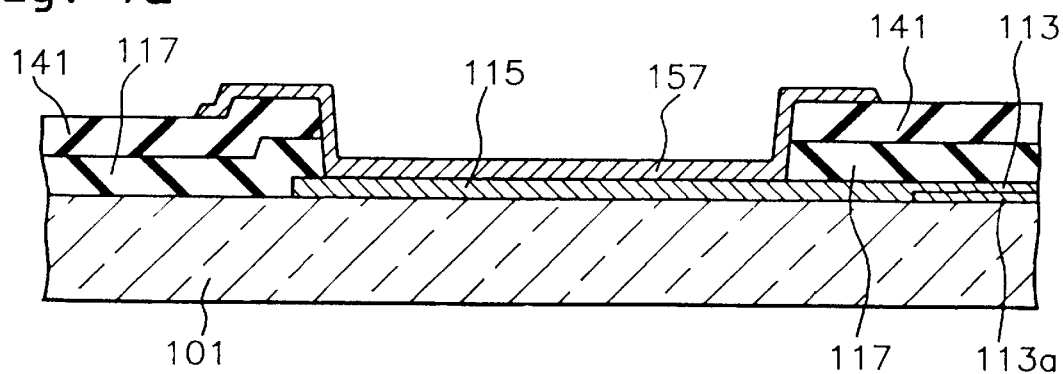
Figure 8D:
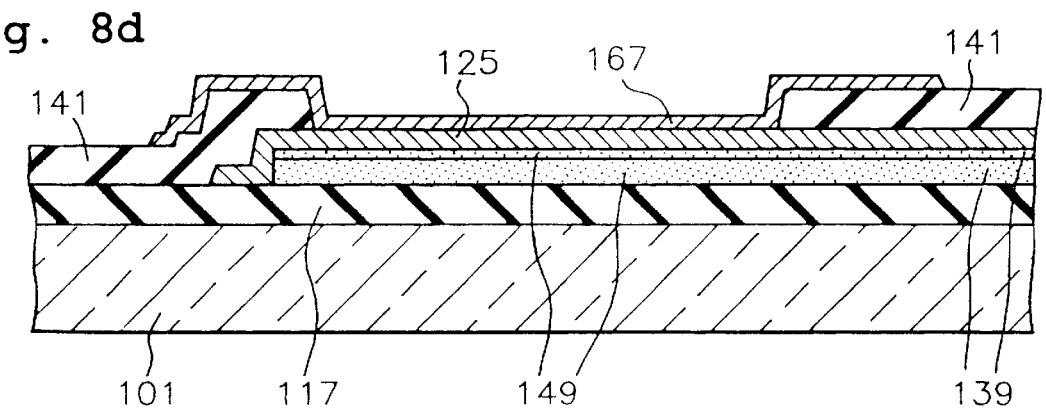
Figure 9D:
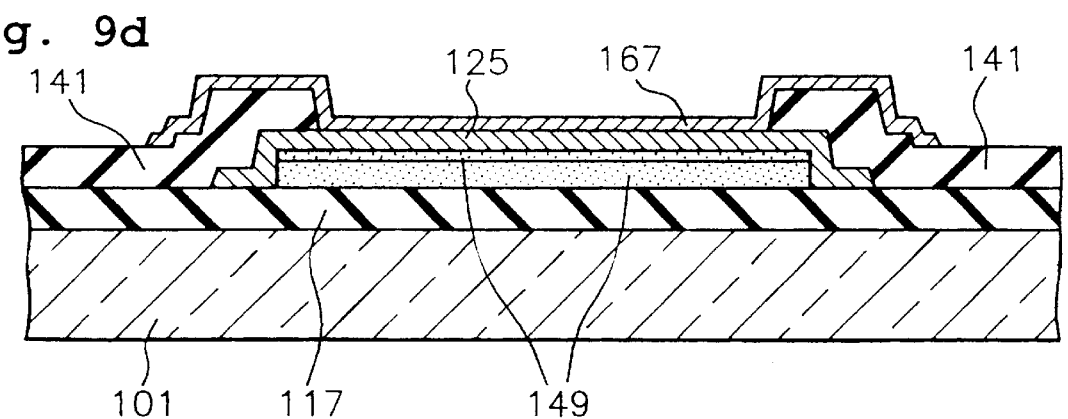

A transparent conductive material such as indium tin oxide is vacuum deposited on the substrate including the protection layer 141 and patterned to form a pixel electrode 133, a source pad connecting terminal 167 and a gate pad connecting terminal 157. The pixel electrode 133 is connected with the drain electrode 131 through the drain contact hole 171 (FIG. 6e). The source pad connecting terminal 167 is connected with the source pad 125 through the source pad contact hole 161 (FIG. 8d and FIG. 9d). The gate pad connecting terminal 157 is connected with the gate pad 115 through the gate pad contact hole 151 (FIG. 7d). In this preferred embodiment, the gate pad portion includes the gate pad 115 made of aluminum and the gate pad connecting terminal 157 made of indium tin oxide and connected with the gate pad 115 through the gate pad contact hole 151. The source pad portion includes the source pad 125 preferably made of a metal which is preferably the same as the metal used to form the source bus line 123, the dummy source pad 149 made of the semiconducting materials 135 and 137 disposed under the source pad 125 and the source pad connecting terminal 167 connected with the source pad 125 through the source pad contact hole 161. Additionally, the dummy source bus line 139 made of the semiconducting material 135 and 137 is formed under the source bus line 123.

EXAMPLE 2

With reference to FIGS. 5, 8a–8d, 9a–9d, 10a–10f and 11a–11d, 9a–9d, 10a–10f and 11a–11d, a second preferred embodiment of the present invention is described in more detail. FIG. 5 is a plan view of an active panel according to a preferred embodiment of the present invention. FIGS. 10a–10f are cross-sectional views showing the manufacturing steps of the TFT of the active panel taken along line VI—VI in FIG. 5. FIGS. 7a–7d are cross-sectional views showing the manufacturing steps of the gate pad and the gate bus line of the active panel taken along line VII—VII in FIG. 5. FIGS. 8a–8d are cross-sectional views showing the manufacturing steps of the source pad and the source bus line of the active panel taken along line VIII—VIII in FIG. 5. FIGS. 9a–9d are cross-sectional views showing the manufacturing steps of the source pad and the source bus line of the active panel taken along line IX—IX. FIGS. 8a–8d and 9a–9d are same as the first preferred embodiment.

Figure 10A:
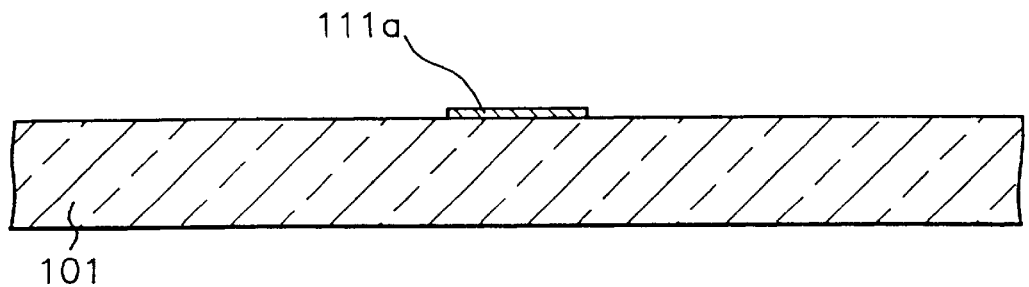
FIGS. 10a–10f are cross-sectional views showing the manufacturing steps of forming a TFT of an active panel according to another preferred embodiment of the present invention.
Figure 11A:
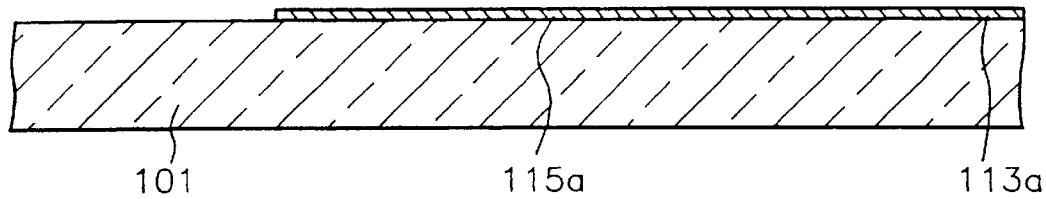
FIGS. 11a–11d are cross-sectional views showing the manufacturing steps of forming a gate pad and a gate bus line of an active panel according to another preferred embodiment of the present invention.

Aluminum or aluminum alloy is vacuum deposited on a transparent substrate 101 and patterned to form a low resistance gate bus line 113a and a low resistance gate electrode 111a and a low resistance gate pad 115a. The low resistance gate electrode 111a preferably extends from the low resistance gate bus line 113a and is formed at a corner of a pixel arranged in a matrix pattern. The low resistance gate pad 115a is formed at an end of the low resistance gate bus line 113a, to which external voltage signal is applied (FIG. 10a and FIG. 11a).

Figure 10B:
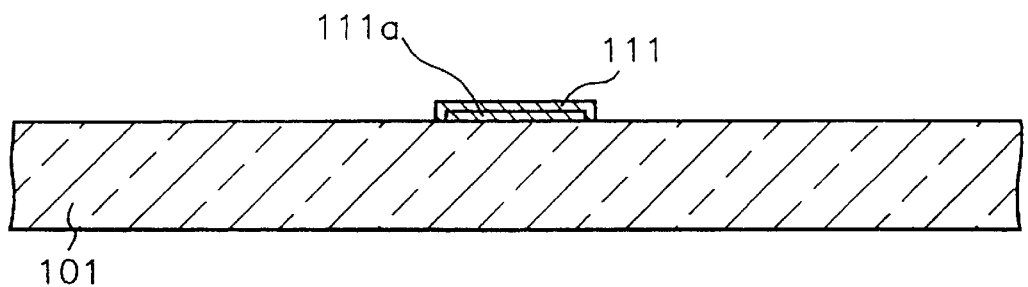
Figure 10C:
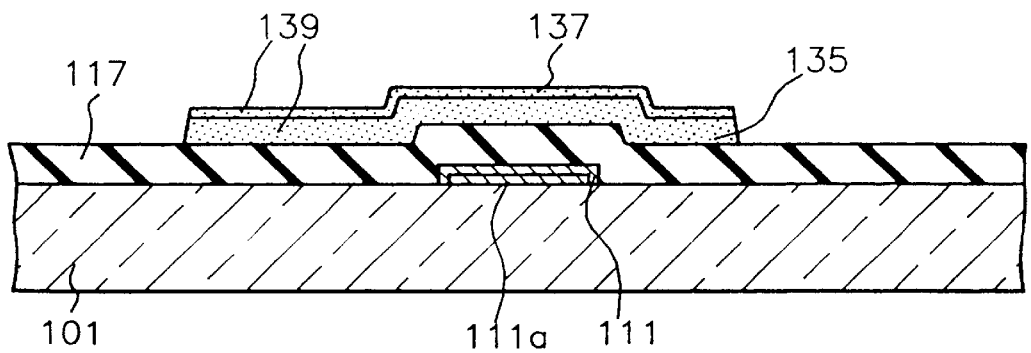
Figure 11B:
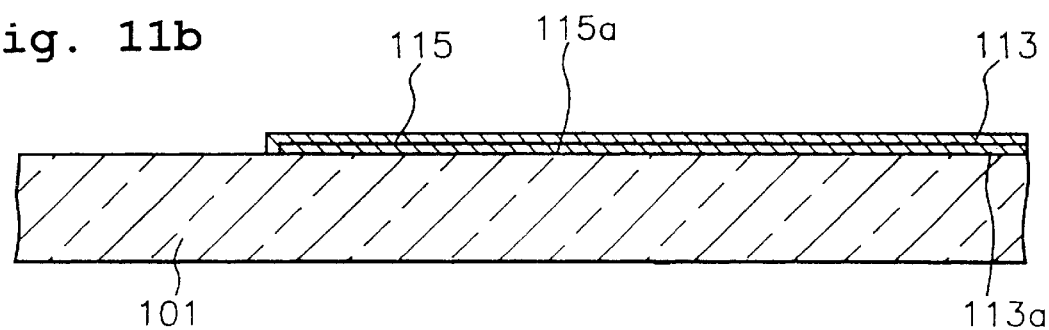

A metal such as chromium, tantalum, molybdenum and antimony is vacuum deposited on the substrate including the low resistance gate bus line 113a, the low resistance gate electrode 111a and the low resistance gate pad 115a, and patterned to form a gate electrode 111, a gate bus line 113 and a gate pad 115. Here, the gate bus line 113, the gate electrode 111, and the gate pad 115 made of the metal such as chromium, tantalum, molybdenum and antimony are formed to cover the low resistance gate bus line 113a, the low resistance gate electrode 111a and the low resistance gate pad 115a made of aluminum so as to prevent hill-lock on the surface of the aluminum (FIG. 10b and FIG. 11b).

An insulating material such as silicon oxide and silicon nitride is vacuum deposited on the substrate including the gate bus line 113, the gate electrode 111 and the gate pad 115 to form a gate insulating layer 117.

Then, a semiconducting material such as intrinsic amorphous silicon and a doped semiconducting material such as impurity doped amorphous silicon are sequentially deposited on the gate insulating layer 117 and patterned to form a semiconductor layer 135 and a doped semiconductor layer 137. During the patterning step, a dummy source bus line 139 and a dummy source pad 149 are formed, respectively, at locations where a source bus line 123 and a source pad 125 are to be formed, preferably by allowing portions of the semiconductor material and the doped semiconductor material to remain at locations corresponding to where a source pad 149 and source bus line 123 will be formed (FIG. 6b, FIG. 8a and FIG. 9a).

Figure 10D:
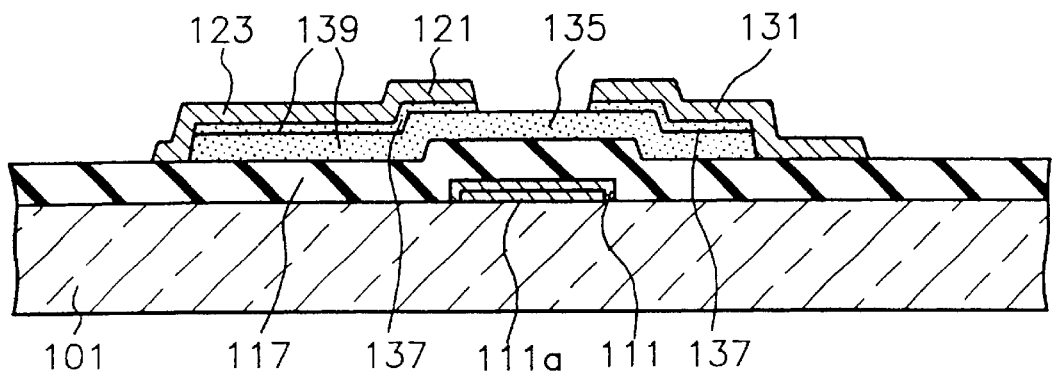
Figure 10E:
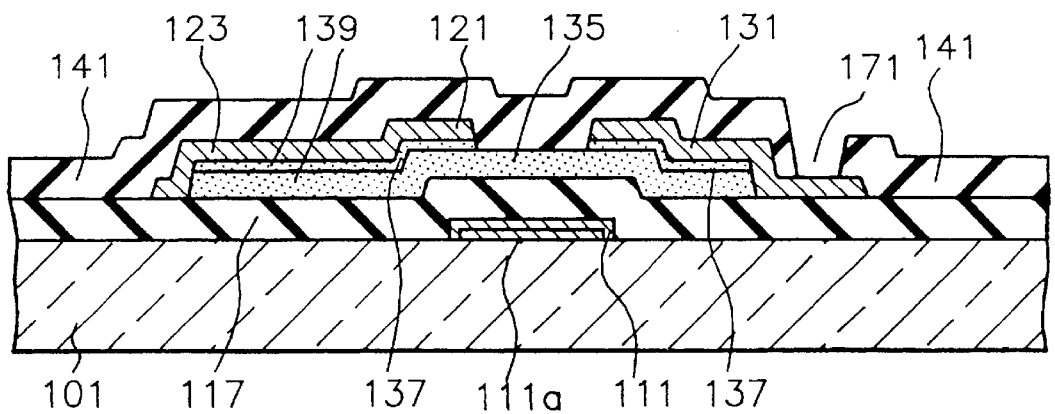

Next, chromium or chromium alloy is vacuum deposited on the substrate including the doped semiconductor layer 137 and patterned to form a source electrode 121, a drain electrode 131, a source bus line 123 and a source pad 125. Here, the source electrode 121 and the drain electrode 131 are formed over the gate electrode 111 and separated from each other. The exposed portion of the doped semiconductor layer 137 between the sourcey electrode 121 and the drain electrode 131 is removed by etching, using the source electrode 121 and the drain electrode 131 as masks (FIG. 10d). The source bus line 123 connects the source electrodes 121 in a row direction. A dummy source bus line 139 preferably made of the semiconducting materials 135 and 137 is formed under the source bus line 123. The source pad 125 is formed at the end of the source bus line 123 and the dummy source pad 149 is formed under the source pad 125. The source bus line 123 and the source pad 125 cover the dummy source bus line 139 and the dummy source pad 149 formed thereunder, respectively (FIG. 8b and FIG. 9b).

Figure 11C:
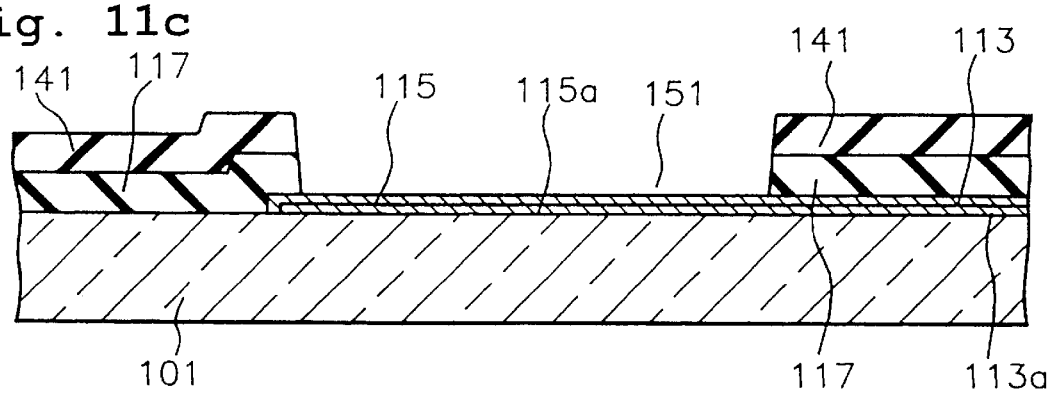

Next, an insulating material such as silicon oxide and silicon nitride is vacuum deposited on the substrate including the source electrode 121, source bus line 123, the source pad 125 and the drain electrode 131 to form a protection layer 141. The protection layer 141 is patterned to form a drain contact hole 171 on the drain electrode 131 (FIG. 10e) and a source pad contact hole 161 on the source pad 125 (FIG. 8c and FIG. 9c). At the same time, the protection layer 141 and the gate insulating layer 117 are simultaneously removed to form a gate pad contact hole 151 on the gate pad 115 (FIG. 11c).

Figure 10F:
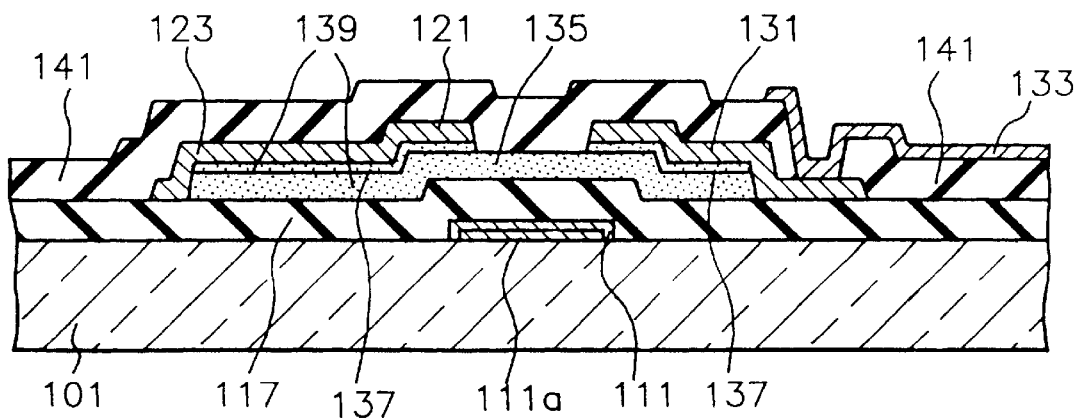
Figure 11D:
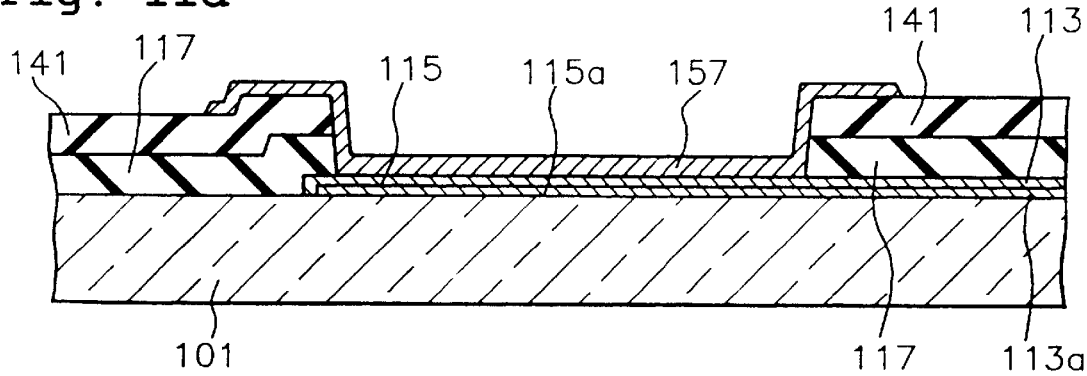

A transparent conductive material such as indium tin oxide is vacuum deposited on the substrate including the protection layer 141 and patterned to form a pixel electrode 133, a source pad connecting terminal 167 and a gate pad connecting terminal 157. The pixel electrode 133 is connected with the drain electrode 131 through the drain contact hole 171 (FIG. 10f). The source pad connecting terminal 167 is connected with the source pad 125 through the source pad contact hole 161 (FIG. 8d and FIG. 9d). The gate pad connecting terminal 157 is connected with the gate pad 115 through the gate pad contact hole 151 (FIG. 11d).

In this preferred embodiment, the gate pad portion includes the gate pad 115 preferably made of aluminum and the gate pad connecting terminal 157 preferably made of indium tin oxide and connected with the gate pad 115 through the gate pad contact hole 151. The source pad portion includes the source pad 125 preferably made of a metal which is preferably the same as a metal used to form the source bus line 123, the dummy source pad 149 made of the semiconducting materials 135 and 137 disposed under the source pad 125 and the source pad connecting terminal 167 connected with the source pad 125 through the source pad contact hole 161. Additionally, the dummy source bus line 139 made of the semiconducting material 135 and 137 is formed under the source bus line 123.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of manufacturing a liquid crystal display comprising:
   providing a substrate;
   forming a gate bus line on the substrate;
   forming an insulating layer on the gate bus line;
   forming a dummy source pad on the insulating layer;
   forming a source bus line and a source pad arranged to completely cover the dummy source pad;
   forming a gate pad at an end of the gate bus line;
   forming a source electrode;
   forming a drain electrode at a distance from the source electrode;
   forming a protection layer on the source electrode;
   forming a drain contact hole on the drain electrode;
   forming a source pad contact hole on the source pad;
   forming a gate pad contact hole on the gate pad; and
   forming a pixel electrode, a source pad connecting terminal and a gate pad connecting terminal on the protection layer.

2. A method of manufacturing a liquid crystal display comprising:
   providing a substrate including a source pad region;
   forming a first gate bus line using a first metal;
   forming a second gate bus line covering the first gate bus line, a gate electrode extending from the second gate bus line and a gate pad at an end of the second gate bus line using a second metal;
   forming a gate insulating layer on the gate electrode;
   forming a semiconductor layer, a doped silicon layer and a dummy source pad on the gate insulating layer, said dummy source pad located substantially at an area of said source pad region; and
   forming a source electrode, a drain electrode, a source bus line and a source pad on the semiconductor layer, using a third metal such that said source pad completely covers said dummy source pad.

3. A method according to claim 2, wherein the step of forming a dummy source pad includes the step of forming at least one of an intrinsic semiconductor layer and a doped semiconductor layer.

4. A method according to claim 2, wherein the step of forming the dummy source pad includes the step of forming a dummy source bus line over which the source pad is to be formed, using the same material used for forming the dummy source pad.

5. A method according to claim 2, further comprising the steps of:
   forming a first gate electrode extending from the first gate bus line and a first gate pad at an end of the first gate bus line;
   wherein the gate electrode comprised of the second metal forms a second gate electrode covering the first gate electrode; and
   wherein the gate pad comprised of the second metal forms a second gate pad covering the first gate pad.

6. A method according to claim 2, wherein the first metal includes aluminum.

7. A method according to claim 2, wherein the second metal includes at least one of chromium, molybdenum, tantalum and antimony.

8. A method according to claim 2, wherein the third metal includes chromium.

9. A method of manufacturing a liquid crystal display comprising:
   providing a substrate;
   forming a first gate bus line using a first metal;
   forming a second gate bus line covering the first gate bus line, a gate electrode extending from the second bus line and a gate pad at an end of the second gate bus line using a second metal;
   forming a gate insulating layer on the gate electrode;
   forming a semiconductor layer, a doped silicon layer and a dummy source pad on the gate insulating layer;
   forming a source electrode, a drain electrode, a source bus line and a source pad on the semiconductor layer, using a third metal such that said source pad completely covers said dummy source pad;
   forming a protection layer on the source electrode;
   forming a drain contact hole on the drain electrode;
   forming a source pad contact hole on the source pad;
   forming a gate pad contact hole on the gate pad; and
   forming a pixel electrode, a source pad connecting terminal and a gate pad connecting terminal on the protection layer.

10. A liquid crystal display comprising:
    a substrate including a source pad region;
    a first gate bus line on the substrate and including a first metal;
    a second gate bus line covering the first gate bus line and including a second metal;
    a gate electrode extending from the second gate bus line;
    a gate pad at an end of the second gate bus line;
    a gate insulating layer covering the gate electrode and the second gate bus line;
    a semiconductor layer on the gate insulating layer and including an intrinsic semiconducting material;
    a doped semiconductor layer on the semiconductor layer and including an impurity doped semiconducting material;
    a dummy source bus line on the gate insulating layer and including at least one of the intrinsic semiconducting material and the impurity doped semiconducting material;
    a dummy source pad at an area of the source pad region on the insulating layer and including at least one of the intrinsic semiconducting material and the impurity doped semiconducting material;
    a source electrode on the doped semiconductor layer and including a third metal;
    a source bus line on the dummy source bus line and being connected with the source electrode, the source bus line including the third metal;
    a source pad on the dummy source pad so as to completely cover the dummy source pad and at an end of the source bus line, the source pad including the third metal; and
    a drain electrode located at a distance away from the source electrode.

11. A liquid crystal display according to claim 10, further comprising:
    a first gate electrode extending from the first gate bus line;
    a first gate pad located at an end of the first gate bus line;
    a second gate electrode covering the first gate electrode; and a second gate pad covering the first gate pad.

12. A liquid crystal display according to claim 10, wherein the first metal includes aluminum.

13. A liquid crystal display according to claim 10, wherein the second metal comprises at least one of chromium, molybdenum, tantalum and antimony.

14. A liquid crystal display according to claim 10, wherein the third metal includes chromium.

15. A liquid crystal display comprising:
a substrate;
a first gate bus line on the substrate and including a first metal;
a second gate bus line covering the first gate bus line and including a second metal;
a gate electrode extending from the second gate bus line;
a gate pad at an end of the second gate bus line;
a gate insulating layer covering the gate electrode and the second gate bus line;
a semiconductor layer on the gate insulating layer and including an intrinsic semiconducting material;
a doped semiconductor layer on the semiconductor layer and including an impurity doped semiconducting material;
a dummy source bus line on the gate insulating layer and including at least one of the intrinsic semiconducting material and the impurity doped semiconducting material;
a dummy source pad on the insulating layer and including at least one of the intrinsic semiconducting material and the impurity doped semiconducting material;
a source electrode on the doped semiconductor layer and including a third metal;
a source bus line on the dummy source bus line and being connected with the source electrode and including the third metal;
a source pad on the dummy source pad so as to completely cover the dummy source pad and at an end of the source bus line, the source pad including the third metal;
a drain electrode located at a distance away from the source electrode;
a protection layer on the source electrode;
a source pad contact hole defined in the source pad;
a gate pad contact hole defined in the gate pad;
a drain contact hole defined in the drain electrode;
a source pad connecting terminal connected with the source pad through the source pad contact hole;
a gate pad connecting terminal connected with the gate pad through the gate pad contact hole; and
a pixel electrode connected with the drain electrode through the drain contact hole, the pixel electrode having a conductive material.

16. A liquid crystal display according to claim 15, wherein the conductive material includes indium tin oxide.

17. A liquid crystal display according to claim 15, wherein the first metal includes aluminum.

18. A liquid crystal display according to claim 15, wherein the second metal includes at least one of chromium, molybdenum, tantalum and antimony.

19. A liquid crystal display according to claim 15, wherein the third metal includes chromium.

20. A method of manufacturing a liquid crystal display, comprising:
providing a substrate;
forming a gate bus line and a gate pad on the substrate, the gate pad being at an end of the gate bus line;
forming an insulating layer on the gate bus line;
forming a dummy source pad on the insulating layer;
forming source and drain electrodes, a source bus line and a source pad arranged to completely cover the dummy source pad;
forming a protection layer on the source and drain electrodes, the protection layer having a gate pad contact hole, a source pad contact hole and a drain contact hole; and
forming a pixel electrode, a source pad connecting terminal and a gate pad connecting terminal on the protection layer.

21. A method according to claim 20, wherein the dummy source pad includes at least one of an intrinsic semiconductor layer and an impurity doped semiconductor layer.

22. A method according to claim 20, wherein the pixel electrode is electrically connected with the drain electrode through the drain contact hole.

23. A method according to claim 20, wherein the gate pad is electrically connected with the gate pad connecting terminal through the gate pad contact hole.

24. A method according to claim 20, wherein the source pad is electrically connected with the source pad connecting terminal through the source pad contact hole.

25. A method of manufacturing a liquid crystal display comprising:
providing a substrate;
forming a first gate bus line using a first metal;
forming a second gate bus line covering the first gate bus line, a gate electrode extending from the second gate bus line and a gate pad at an end of the second gate bus line using a second metal;
forming a gate insulating layer on the gate electrode;
forming a semiconductor layer, a doped silicon layer and a dummy source pad on the gate insulating layer;
forming a source electrode, a drain electrode, a source bus line and a source pad on the semiconductor layer, using a third metal such that the source pad completely covers the dummy source pad;
forming a protection layer on the source and drain electrodes, the protection layer having a gate pad contact hole, a source pad contact hole and a drain contact hole; and
forming a pixel electrode, a source pad connecting terminal and a gate pad connecting terminal on the protection layer.

26. A method according to claim 25, wherein the first metal includes aluminum.

27. A method according to claim 25, wherein the second metal includes at least one of chromium, molybdenum, tantalum and antimony.

28. A method according to claim 25, wherein the third metal includes chromium.

29. A liquid crystal display comprising:
a substrate;
a first gate bus line on the substrate and including a first metal;
a second gate bus line covering the first gate bus line and including a second metal;
a gate electrode extending from the second gate bus line;
a gate pad at an end of the second gate bus line;
a gate insulating layer covering the gate electrode and the second gate bus line;

a semiconductor layer on the gate insulating layer and including an intrinsic semiconducting material;

a doped semiconductor layer on the semiconductor layer and including an impurity doped semiconducting material;

a dummy source bus line on the gate insulating layer and including at least one of the intrinsic semiconducting material and the impurity doped semiconducting material;

a dummy source pad at an area of a source pad region on the insulating layer and including at least one of the intrinsic semiconducting material and the impurity doped semiconducting material;

a source electrode on the doped semiconductor layer and including a third metal;

a source bus line on the dummy source bus line and being connected with the source electrode and including the third metal;

a source pad on the dummy source pad so as to completely cover the dummy source pad and at an end of the source bus line, the source pad including the third metal;

a drain electrode located at a distance away from the source electrode;

a protective layer on the source and drain electrodes and having a source pad contact hole, a gate pad contact hole and a drain contact hole;

a source pad connecting terminal connected with the source pad through the source pad contact hole;

a gate pad connecting terminal connected with the gate pad through the gate pad contact hole; and a pixel electrode connected with the drain electrode through the drain contact hole.

30. A liquid crystal display according to claim 29, further comprising:

a first gate electrode extending from the first gate bus line;

a first gate pad at an end of the first gate bus line;

a second gate electrode covering the first gate electrode; and a second gate pad covering the first gate pad.

31. A liquid crystal display according to claim 29, wherein the first metal includes aluminum.

32. A liquid crystal display according to claim 29, wherein the second metal includes at least one of chromium, molybdenum, tantalum and antimony.

33. A liquid crystal display according to claim 29, wherein the third metal includes chromium.

* * * * *